US012738936B1

(12) United States Patent
Fierro et al.

(10) Patent No.: US 12,738,936 B1

(45) Date of Patent: Sep. 15, 2026

(54) SOLID-STATE POWER GATE DRIVER CIRCUIT FOR AC/DC APPLICATIONS

(71) Applicant: Schneider Electric USA, Inc., Andover, MA (US)

(72) Inventors: Gregorio Valdovinos Fierro, Apodaca (MX); Manuel Antonio Becerra, Santiago (MX); Gabriela Villa Ruiz, Monterrey (MX); Gustavo Garcia Rivero, Apodaca (MX)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 19/187,332

(22) Filed: Apr. 23, 2025

(51) Int. Cl.
*H03K 17/687* (2006.01)

(52) U.S. Cl.
CPC .................................. *H03K 17/687* (2013.01)

(58) Field of Classification Search
CPC .................................................... H03K 17/687
See application file for complete search history.

(56) References Cited

U.S. PATENT DOCUMENTS 12,015,261 B2 * 6/2024 Telefus ................ G01R 15/202
12,573,550 B2 * 3/2026 Parsa Sirat ............. H01F 38/30
2006/0244620 A1 * 11/2006 Sotiriou ............... G08B 21/182 340/815.4
2016/0344311 A1 * 11/2016 Sun .......................... H02P 7/05
2024/0088716 A1 * 3/2024 Green ..................... H02J 50/12
2026/0005552 A1 * 1/2026 Luzinski ................. H02J 50/80
2026/0142690 A1 * 5/2026 Kapolnek ................ H04B 5/79

* cited by examiner

*Primary Examiner* — Adam D Houston

(74) *Attorney, Agent, or Firm* — Quinn IP Law

(57) ABSTRACT

A solid-state gate driver (SSGD) circuit for energizing an electrical load includes a bilateral transistor switch connected to the load, positive and negative branch circuits each connected to the bilateral transistor switch, and a microcontroller. The positive branch circuit includes a first plurality of semiconductor power switches directing energy from a positive half-cycle of an alternating current (AC) input voltage to the load via the bilateral transistor switch. The negative branch circuit includes a second plurality of semiconductor power switches directing energy from a negative half-cycle of the A C input voltage to the load via the bilateral transistor switch. In response to input signals, the microcontroller controls an ON/OFF switching state of the semiconductor power switches and bilateral transistor switch to energize the load. The input voltage may be a direct current DC voltage. The SSGD circuit may form a solid-state circuit breaker or relay.

20 Claims, 10 Drawing Sheets

SOLID-STATE POWER GATE DRIVER CIRCUIT FOR AC/DC APPLICATIONS

TECHNICAL FIELD

The present disclosure relates generally to solid-state gate driver circuit architectures and automatic switching control methodologies for energizing a connected electrical load.

BACKGROUND

Voltage-controlled semiconductor power switches are used in a myriad of applications. For instance, metal-oxide semiconductor field effect transistors (MOSFETs) are often used as high-frequency power switches in low-power to medium-power applications. MOSFETs in turn may be used to construct various complementary metal-oxide semiconductor (CMOS) topologies. In a representative CMOS architecture, for instance, n-channel metal-oxide semiconductor (NMOS) transistors and p-channel metal-oxide semiconductor (PMOS) transistors may be used to control power flow within an electrical circuit.

An NMOS transistor turns on to conduct an electric current when a gate voltage of the transistor exceeds a low threshold voltage, which is typically a minimum of 0.7 volts (V). The NMOS transistor turns off again when the gate voltage drops below the threshold voltage. In contrast, a PMOS transistor conducts an electric current/turns on when its gate voltage drops below the above-noted threshold voltage, i.e., when a sufficiently negative gate voltage is applied to its gate terminal, with the negative gate voltage typically being a minimum of −0.7V for a PMOS transistor. The PMOS transistor turns off/opens when the applied gate voltage exceeds the threshold voltage. Relative to mechanical switches, MOSFETs and other solid-state switches are readily controllable via switching control signals from microcontrollers/control chips, require minimal power, have no moving parts, enjoy vastly increased lifespans, and provide faster switching speeds.

SUMMARY

The present disclosure is directed toward a solid-state gate driver (SSGD) circuit, e.g., a solid-state circuit breaker (SSCB) or a solid-state relay (SSR). The disclosed topologies have a reduced circuit complexity and lower power dissipation level relative to existing designs such as metal-oxide semiconductor field effect transistor (MOSFET) relays, photovoltaic-based or transformer-based MOSFET driver circuits, dual optocoupler-based configurations, and the like.

The solid-state circuit architecture described herein is configured to energize a connected electrical load. In an alternating current (AC) embodiment of the present disclosure, this occurs over separately controlled positive and negative branch circuits. The separate branch circuits are constructed from an arrangement of electronic components, including semiconductor power switches, steering and Zener diodes, capacitors, and resistors. Corresponding ON/OFF switching states of the various switches are controllable via a microcontroller in the various embodiments.

A representative embodiment of the SSGD circuit includes a bilateral transistor switch connected to an electrical load, positive and negative branch circuits connected to the bilateral transistor switch, and a microcontroller. The positive branch circuit includes a first plurality of semiconductor power switches configured to direct energy to the load from a positive half-cycle of an AC input voltage. In an analogous manner, the negative branch circuit includes a second plurality of semiconductor power switches configured to direct energy to the load from a negative half-cycle of the A C input voltage. The directed energy is therefore referred to herein as positive and negative energy for descriptive clarity. The microcontroller in this embodiment is programmed in software and equipped in hardware, i.e., configured, to control the bilateral transistor switch and ON/OFF switching states of constituent switches of the first and second pluralities of semiconductor power switches.

The SSGD circuit in one or more implementations may include a current sensor connected to the bilateral transistor switch and to the load. The current sensor, e.g., a bipolar Hall effect sensor in a non-limiting implementation, is configured to measure a current output of the bilateral transistor switch to the load, and to communicate, transmit, or otherwise provide a current magnitude and polarity as part of a set of input signals to the microcontroller, with the input signals collectively informing the microcontroller's switching control functions.

The first plurality of semiconductor power switches in one or more representative implementations includes three n-channel metal-oxide semiconductor (NMOS) transistors and a single p-channel metal-oxide semiconductor (PMOS) transistor. The second plurality of semiconductor power switches may include a single NMOS transistor and a single PMOS transistor. The PMOS transistors are connected between the bilateral transistor switch and the single NMOS transistor in a representative configuration.

The SSGD circuit in its various constructions is characterized by an absence of an operational amplifier, thus improving operating efficiency and reducing complexity.

The first and second pluralities of semiconductor power switches in a possible configuration together form three half-wave rectifiers operable as three separate power sources. In such a topology, a first power source of the three separate power sources is part of the positive branch circuit. A Zener diode is connected in parallel with a capacitor. Both components are connected to the first power source. Use of the Zener diode in this implementation limits a voltage stored in the capacitor.

Also disclosed herein is a method for energizing the electrical load via the described SSGD circuit. The method in accordance with an embodiment includes receiving the above-noted input signals via a microcontroller, the input signals being indicative, at least in part, of a magnitude and a polarity of an electric current being delivered to an electrical load by a bilateral transistor switch of the SSGD circuit. The SSGD circuit includes the bilateral transistor switch and separate positive and negative branch circuits.

The method in one or more implementations may include directing positive energy from a positive half-cycle of an AC input voltage to the load via operation of the positive branch circuit and the bilateral transistor switch. Directing the positive energy from the positive half-cycle may include controlling, via the microcontroller, an ON/OFF state of the bilateral transistor switch and a first plurality of semiconductor power switches of the positive branch circuit.

The method also includes directing negative energy from a negative half-cycle of the AC input voltage to the load. This action occurs via operation of the negative branch circuit and the bilateral transistor switch. Directing the energy from the negative half-cycle may include controlling an ON/OFF state of a second plurality of semiconductor power switches of the negative branch circuit, with this control action occurring via programmed operation of the microcontroller.

In another disclosed implementation operable for supporting direct current (DC) applications, i.e., those in which the power supply is a DC source such as a battery pack, or alternatively a fuel cell stack, solar panels, etc., the SSGD circuit includes a bilateral transistor switch connected to the electrical load, and a plurality of semiconductor power switches configured to direct energy from a DC input voltage to the electrical load via the bilateral transistor switch. The semiconductor power switches may include three NMOS transistors. The bilateral transistor switch may be connected to one of the three NMOS transistors in a possible embodiment, with control established via traditional switching control algorithms such as pulse width modulation (PWM).

Alternatively, the semiconductor power switches may include the three NMOS transistors and a steering diode connected to a capacitor, with the capacitor being connected to ground. Control in this topology may be performed using a linear slope control algorithm. The steering diode is connected to the bilateral transistor switch and to one of the three NMOS transistors. The microcontroller is configured, in response to input signals, to control an ON/OFF switching state of the semiconductor power switches and the bilateral transistor switch when energizing the load. As noted above for AC applications, the SSGD circuit for DC applications is characterized by an absence of an operational amplifier.

The above summary is not intended to represent every embodiment or aspect of the present disclosure. Rather, the foregoing summary includes examples of certain novel aspects and features as set forth herein. The above noted and other features and advantages of the present disclosure will be readily apparent from the following detailed description of representative embodiments and modes for carrying out the present disclosure when taken in connection with the accompanying drawings and the appended claims.

BRIEF DESCRIPTION OF THE DRAWINGS

The drawings described herein are for illustrative purposes only, are schematic in nature, and are intended to be examples rather than limit the scope of the disclosure.

Figure 1:
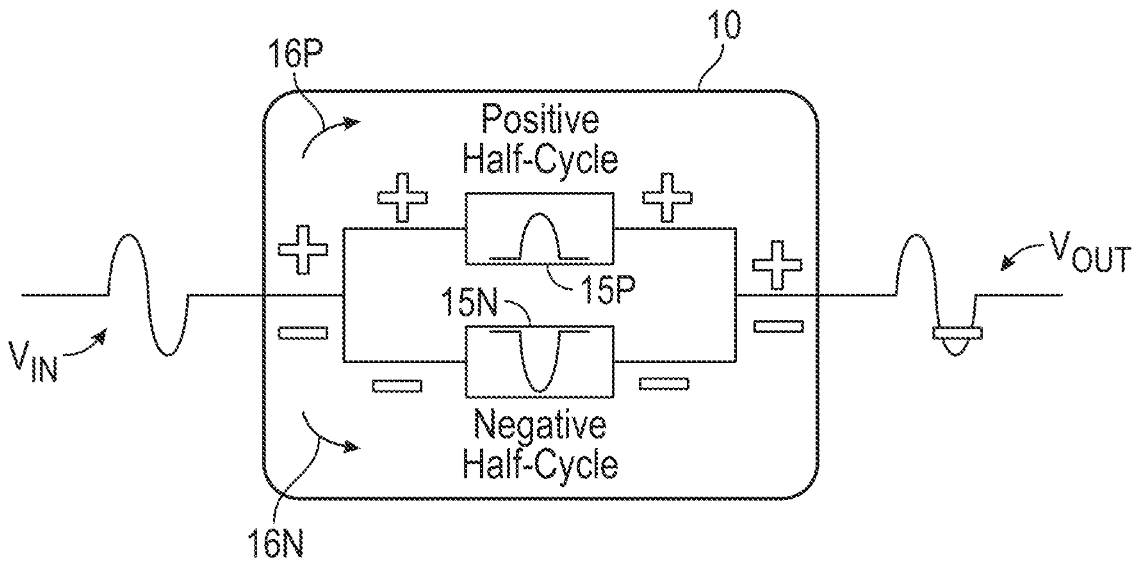
FIG. 1 illustrates a solid-state gate driver (SSGD) circuit, e.g., a solid-state circuit breaker or a solid-state relay, with the SSGD circuit having separate positive and negative branch circuits energizing an electrical load in accordance with the present disclosure.

The present disclosure may be modified or embodied in alternative forms, with representative embodiments shown in the drawings and described in detail below. Inventive aspects of the present disclosure are not limited to the disclosed embodiments. Rather, the present disclosure is intended to cover alternatives falling within the scope of the disclosure as defined by the appended claims.

DETAILED DESCRIPTION

Referring to the drawings, wherein like reference numbers refer to the same or similar components throughout the several views, a solid-state gate driver (SSGD) circuit 10 is illustrated in FIG. 1. The SSGD circuit 10, embodiments of which are described in detail below with further reference to FIGS. 2-7, is connectable to an electrical load 12 and an external power supply 14, with the load 12 and power supply 14 illustrated in FIGS. 2-6B. The disclosed circuit topologies are adaptable for use in alternating current (AC) or direct current (DC) applications.

In an AC application as illustrated in FIG. 1, the power supply 14 provides an input voltage $V_{IN}$ to the SSGD circuit 10, e.g., as typical 120V/60 hertz (Hz) (or 230V/50 Hz) grid power, or alternatively as an A C output of an A C generator, alternator, or power inverter as appreciated in the art. In a DC implementation, examples of which are described below with reference to FIGS. 6A and 6B, the SSGD circuit 10 may be connected to a suitable DC power supply 140, for instance an electrochemical battery pack, a fuel cell stack, a DC generator, a solar panel system, or another application suitable power supply. The SSGD circuit 10 in its various implementations ultimately provides an output voltage $V_{OUT}$ connected to the electrical load 12.

Figure 4:
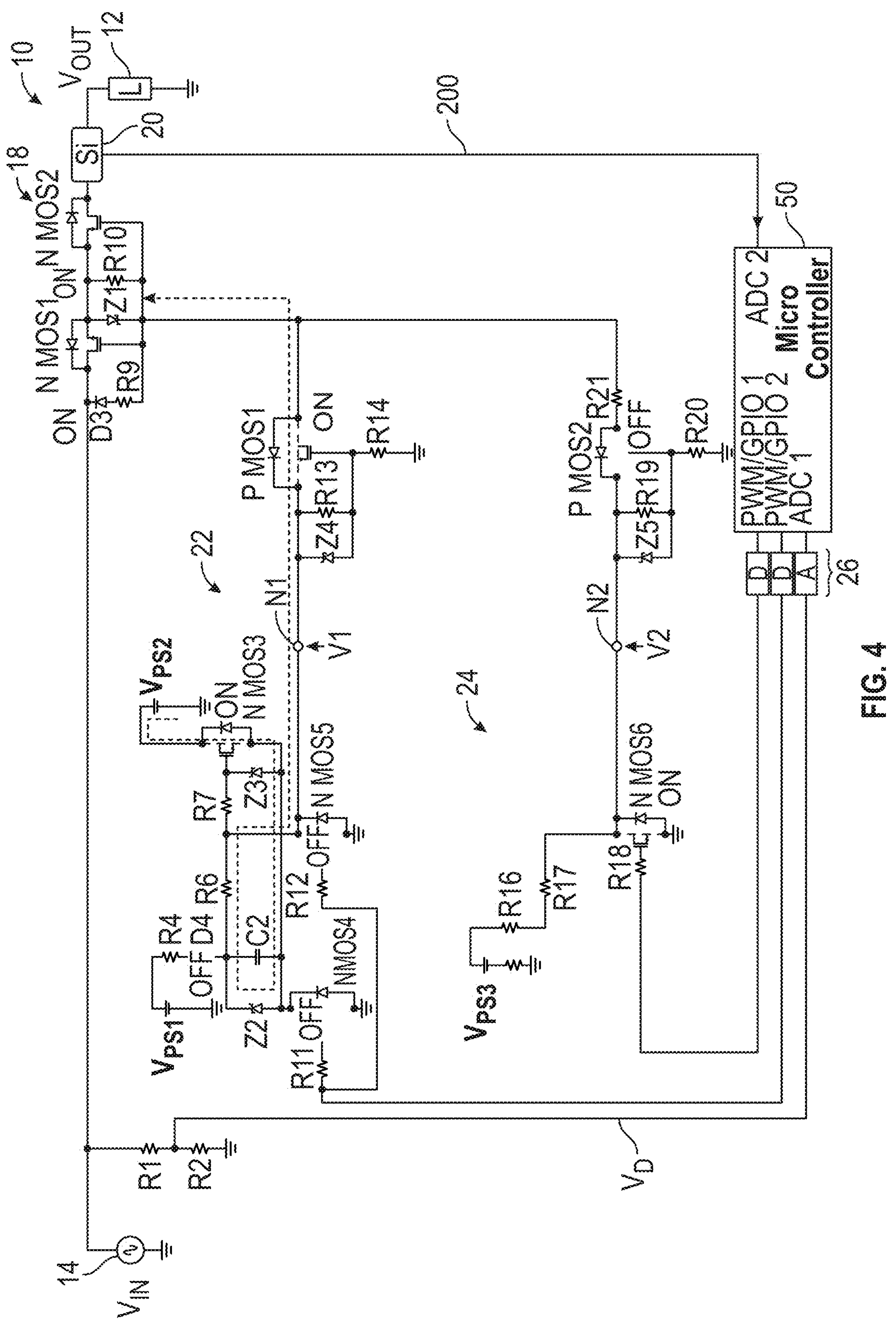
FIG. 4 illustrates operation of the SSGD circuit of FIG. 2B during a positive half-cycle of the A C input voltage.
Figure 5:
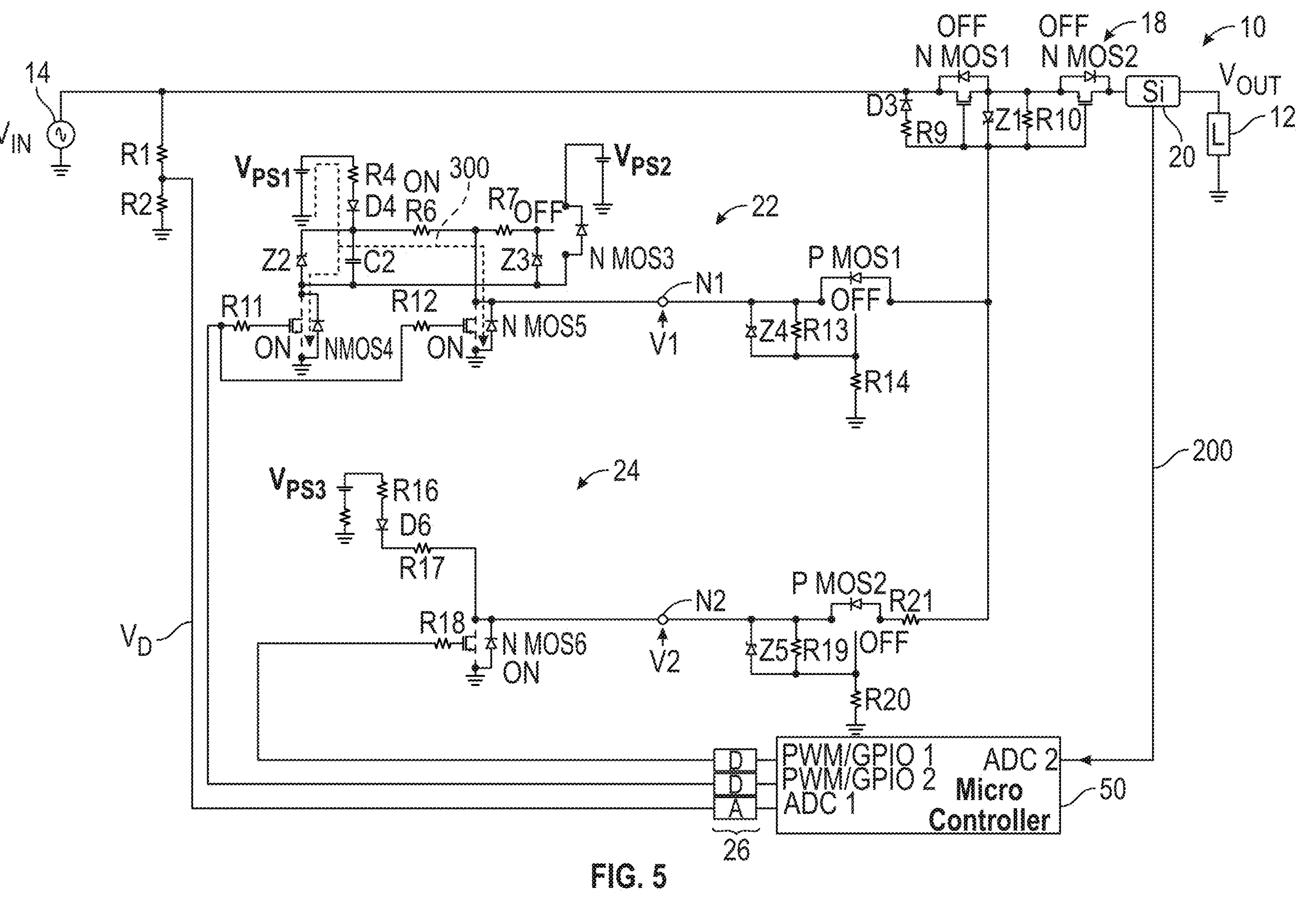
FIG. 5 illustrates an OFF state of the SSGD circuit of FIG. 2B during which A C power is not provided to the electrical load.

As part of its configured functionality, the SSGD circuit 10 of FIG. 1, when connected to an AC power supply (FIGS. 2-5) separately processes positive and negative half-cycles 15P and 15N of the A C input voltage $V_{IN}$. This occurs via respective positive and negative branch circuits 16P and 16N, with operation of the latter being illustrated in FIG. 1 as indicated by the negative polarity symbol (−). As appreciated in the art, the positive and negative half-cycles 15P and 15N represent different directions of energy flow, i.e., positive and negative energy flow, respectively. The positive half-cycle 15P of an AC waveform is present when the input voltage $V_{IN}$ is positive and an electric current flows in a nominal forward or positive direction. During the negative half cycle 15N, the input voltage $V_{IN}$ becomes negative and the current reverses polarity. Energy continues to flow to the electrical load 12 in either case unless the SSGD circuit 10 is transitioned to an OFF state (FIG. 5). Construction and use of the positive and negative branch circuits 16P and 16N may be used to reduce distortion, circuit complexity, and power dissipation relative to competing circuit topologies.

Figure 2:
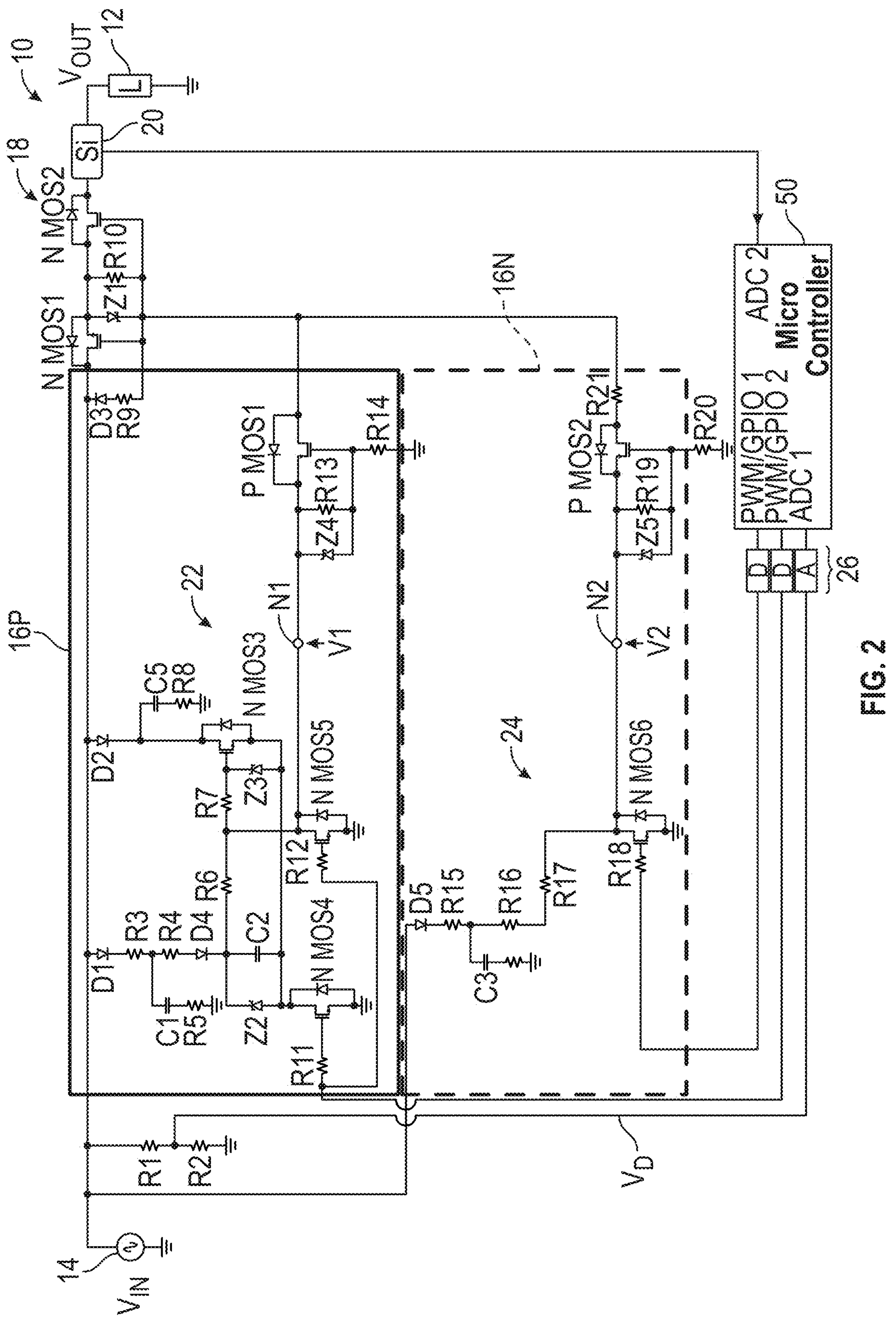
FIG. 2 is an example circuit topology for implementing the SSGD circuit of FIG. 1.

Referring to FIG. 2, the solid-state gate driver (SSGD) circuit 10 is connected to the power supply 14 (far left) and the electrical load (L) 12 (far right). The above-noted positive branch circuit 16P and negative branch circuit 16N may be implemented using a variety of electronic circuit components. The SSGD circuit 10 also includes a bilateral transistor switch 18 connected to the electrical load 12, with the positive branch circuit 16P and the negative branch circuit 16N each connected to the bilateral transistor switch 18 as shown. The bilateral transistor switch 18 in the representative implementation of FIG. 2 includes back-toback NMOSs, i.e., consecutive first and second NMOS transistors NMOS1 and NMOS2, with other transistor-based constructions of the bilateral transistor switch 18 being possible within the scope of the disclosure.

Additional electronic components may be used to implement the bilateral transistor switch 18, including resistors R9 and R10, diode D3, and Zener diode Z1 as shown. Additionally, a current sensor (Si) 20, e.g., a bipolar H all effect sensor, or another suitable current measurement device such as a shunt resistors, giant magneto-resistive (GMR) sensor, fluxgate sensor, etc., may be connected to the bilateral transistor switch 18 and the electrical load 12. The current sensor 20 is configured to measure a current output of the bilateral transistor switch 18 to the load 12, and to output and communicate one or more current signals 200 to the microcontroller 50. The current signals 200, e.g., electronic signals indicative of a magnitude and a polarity of the current output from the bilateral transistor switch 18, may act as part of a set of input signals to the microcontroller 50 within the scope of the present disclosure.

The positive branch circuit 16P in the illustrated topology of FIG. 2 includes a first plurality of semiconductor power switches 22. The power switches 22 are configured to direct positive energy from the positive half-cycle 15P (FIG. 1) of the input voltage $V_{IN}$ to the electrical load 12. This occurs via operation of the bilateral transistor switch 18. In a comparable manner, the negative branch circuit 16N includes a second plurality of semiconductor power switches 24 configured to direct negative energy from the negative half-cycle 15N (FIG. 1) of the input voltage $V_{IN}$ to the electrical load 12, likewise via operation of the bilateral transistor switch 18. As with the bilateral transistor switch 18, the power switches 22 and 24 in the non-limiting MOSFET embodiment are illustrated with an intrinsic body diode/parasitic diode, as appreciated by those skilled in the art.

POSITIVE BRANCH CIRCUIT (16P): In the representative AC circuit topology shown in FIG. 2, the first plurality of semiconductor power switches 22 includes a single PMOS transistor PMOS1 along with three NMOS transistors, i.e., nominally NMOS3, NMOS4, and NMOS5 to differentiate from the NMOS1 and NMOS2 of the bilateral transistor switch 18. The positive branch circuit 16P additionally includes electronic components in the form of steering diodes D1 and D2, resistors R3, R4, R5, R6, R7, R8, R11, R12, R13, and R14, and capacitors C1, C2, and C5. Zener diodes Z2, Z3, and Z4 complete the positive branch circuit 16P. Voltage node N1 is located between NMOS5 and PMOS1 as shown, and carries an output voltage V1 at that location.

NEGATIVE BRANCH CIRCUIT (16N): The second plurality of semiconductor power switches 24 in the illustrated configuration includes a single PMOS transistor, i.e., PMOS2, and a single NMOS transistor (NMOS6). The negative branch circuit 16N additionally includes electronic components in the representative form of a steering diode D5, resistors R15, R16, R17, R18, R19, R20, and R21, a capacitor C3, and a Zener diode Z5. Voltage node N2 is located between NMOS6 and PMOS2 as shown, and carries an output voltage V2 at that location.

A microcontroller 50 of the solid-state gate driver (SSGD) circuit 10 may be configured, in response to the current signal 200 and possibly other input signals such as measured temperature (not shown), a voltage $V_D$, a demand for the load 12, etc., to control an ON/OFF switching state of the first and second pluralities of semiconductor power switches 22 and 24, and NMOS1 and NMOS2 of the bilateral transistor switch 18. These actions energize the electrical load 12. In general, the microcontroller 50 may include analog-to-digital converters A DC1 and A DC2, with the former connected to (i) a voltage divider formed by resistors R1 and R2 and (ii) an analog isolator (A) of an isolator circuit 26, and the latter connected to the current sensor 20. The microcontroller 50 in one or more embodiments may be configured to perform pulse width modulation (PWM) or another suitable switching control technique, with PWM outputs connected to magnetic and/or capacitive digital isolators (D) of the isolator circuit 26.

Other functions such as Linear Slope Control (LSC) may be performed by the microcontroller 50 in other implementations, and thus the microcontroller 50 may also have general purpose input/output pins GPIO1, GPIO 2 as illustrated in FIG. 2, e.g., for status monitoring, binary control functions, fault detection, etc. The resistors R1 and R2 may be included in the overall circuitry of the SSGD circuit 10 as shown. The resistors R1 and R2 together form the above-noted voltage divider connected to the A DC1 input of the microcontroller 50, providing the voltage $V_D$ to the microcontroller 50 as an additional input signal via the analog isolator (A). The first and second pluralities of semiconductor power switches 22 and 24 are controlled via voltage control signals from the microcontroller 50 as appreciated in the art, e.g., via the digital isolators (D) of the isolator circuit 26.

Figure 2A:
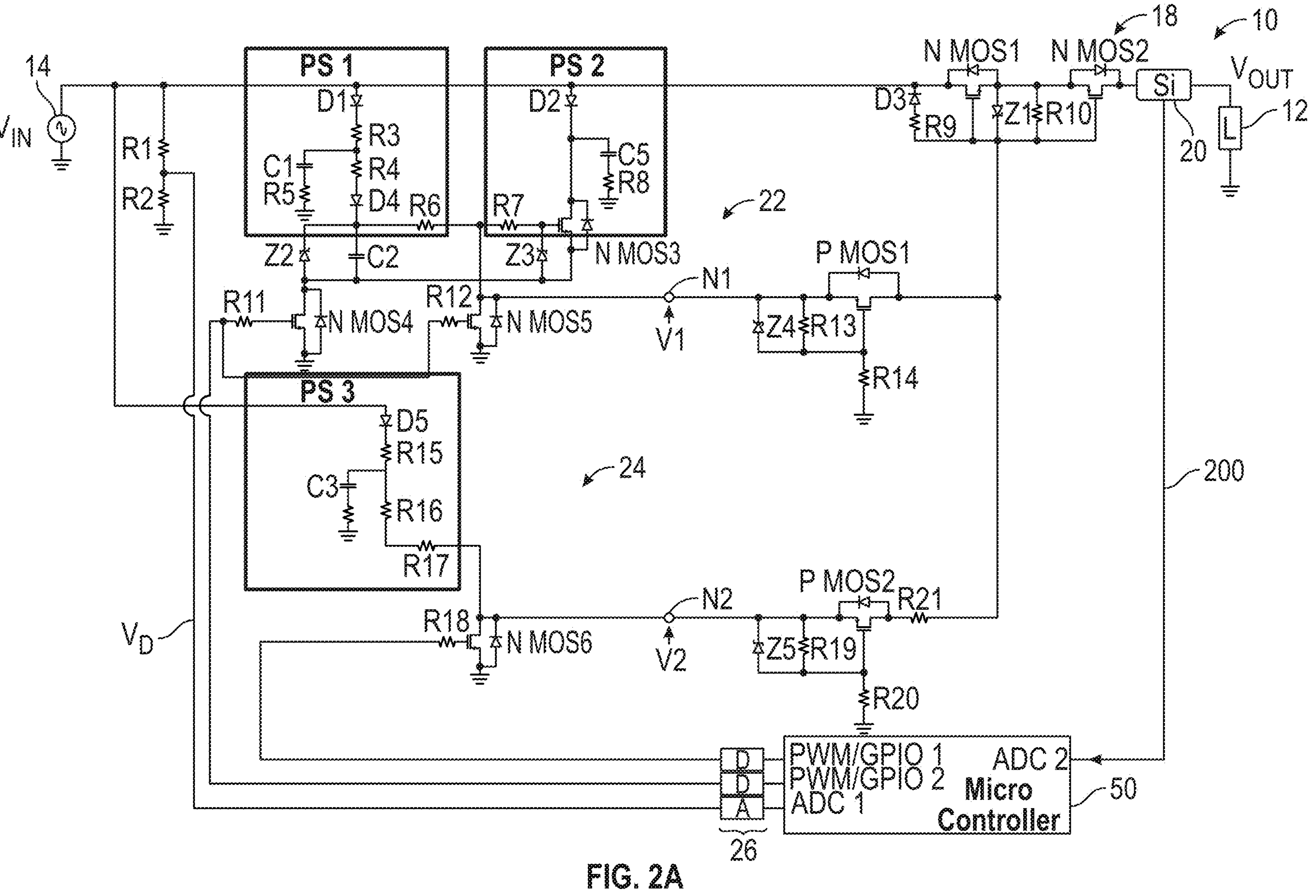
FIGS. 2A and 2B are representations of the SSGD circuit of FIG. 2 illustrating the presence of three separate power supplies within the circuit topology of FIG. 2.

Referring to FIG. 2A, the representative topology of the SSGD circuit 10 of FIG. 2 described above includes multiple power sources, i.e., first power source PS1 and second power source PS2 for the positive branch circuit 16P of FIG. 2. The third power source PS3 is part of the negative branch circuit 16N. Power sources PS1, PS2, and PS3 may be constructed as three half-wave rectifiers. However, the power sources PS1, PS2, and PS3 are not limited to the illustrated half-wave rectifier topology. Rather, the power sources can be implemented using other topologies within the scope of the present disclosure, e.g., as switching power supplies. During the positive half-cycle 15P (FIG. 1) of the input voltage $V_{IN}$, the power sources PS1 and PS2 conduct current, allowing the current to pass to the load 12. During the negative half-cycle 15N of FIG. 1, current passing through the positive branch circuit 16P is blocked, resulting in a zero output voltage at node N1.

Figure 2B:
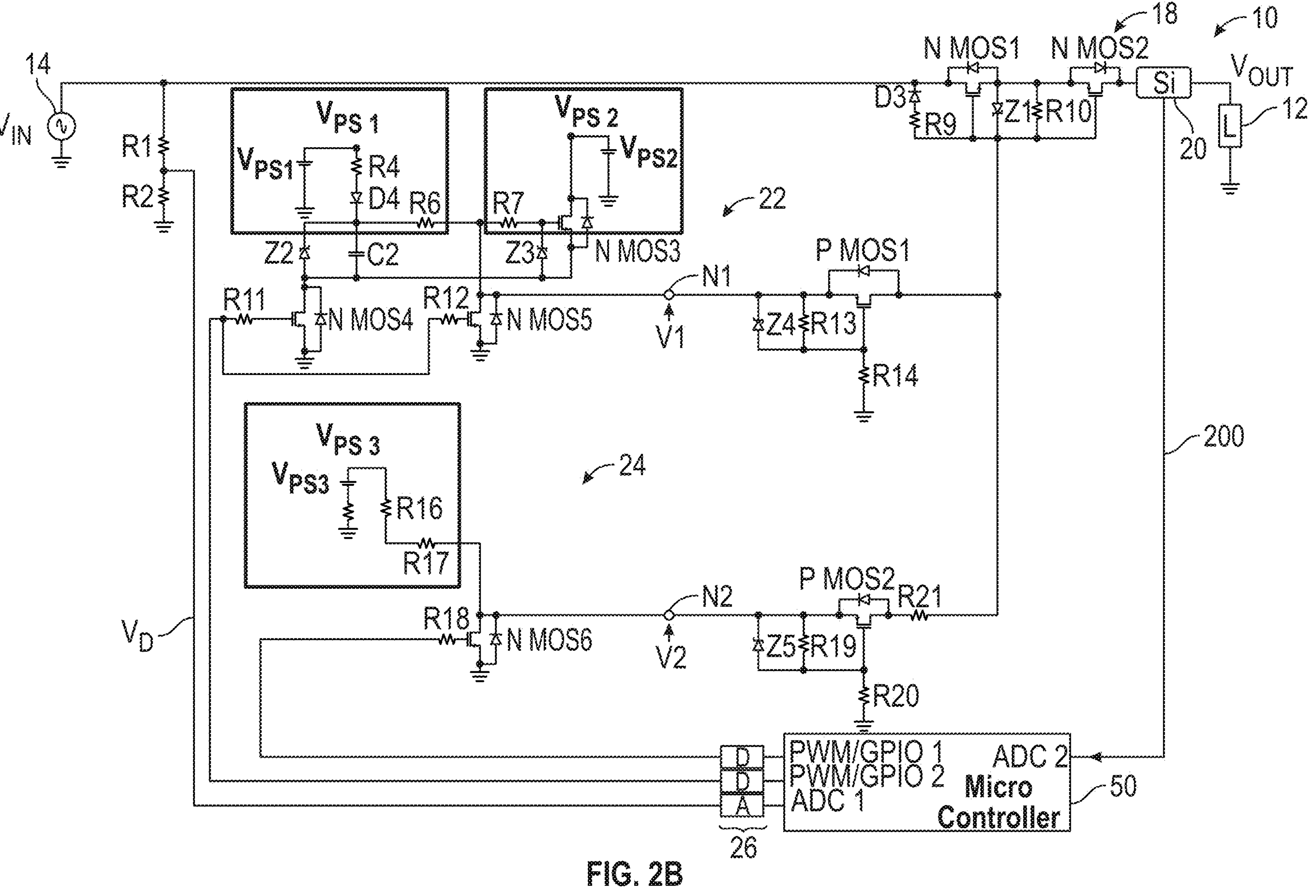

Thus, an aspect of the circuit topology of FIG. 2A is that the first plurality of semiconductor power switches 22 of the positive branch circuit 16P (FIG. 2) and the second plurality of semiconductor power switches 24 of the negative branch circuit 16N of FIG. 2 together include three half-wave rectifiers operable as the three separate power sources PS1, PS2, and PS3. The third power source PS3 is part of the negative branch circuit 16N of FIG. 2 as noted above. The Zener diode Z2 is connected in parallel with the capacitor C2 to store a voltage in capacitor C2 during the negative half-cycle. The circuit of FIG. 2A may be simplified as shown in FIG. 2B, with the power supplies PS1, PS2, and PS3 of FIG. 2A represented as voltage power supplies $V_{PS1}$, $V_{PS2}$, and $V_{PS3}$.

Figure 3:
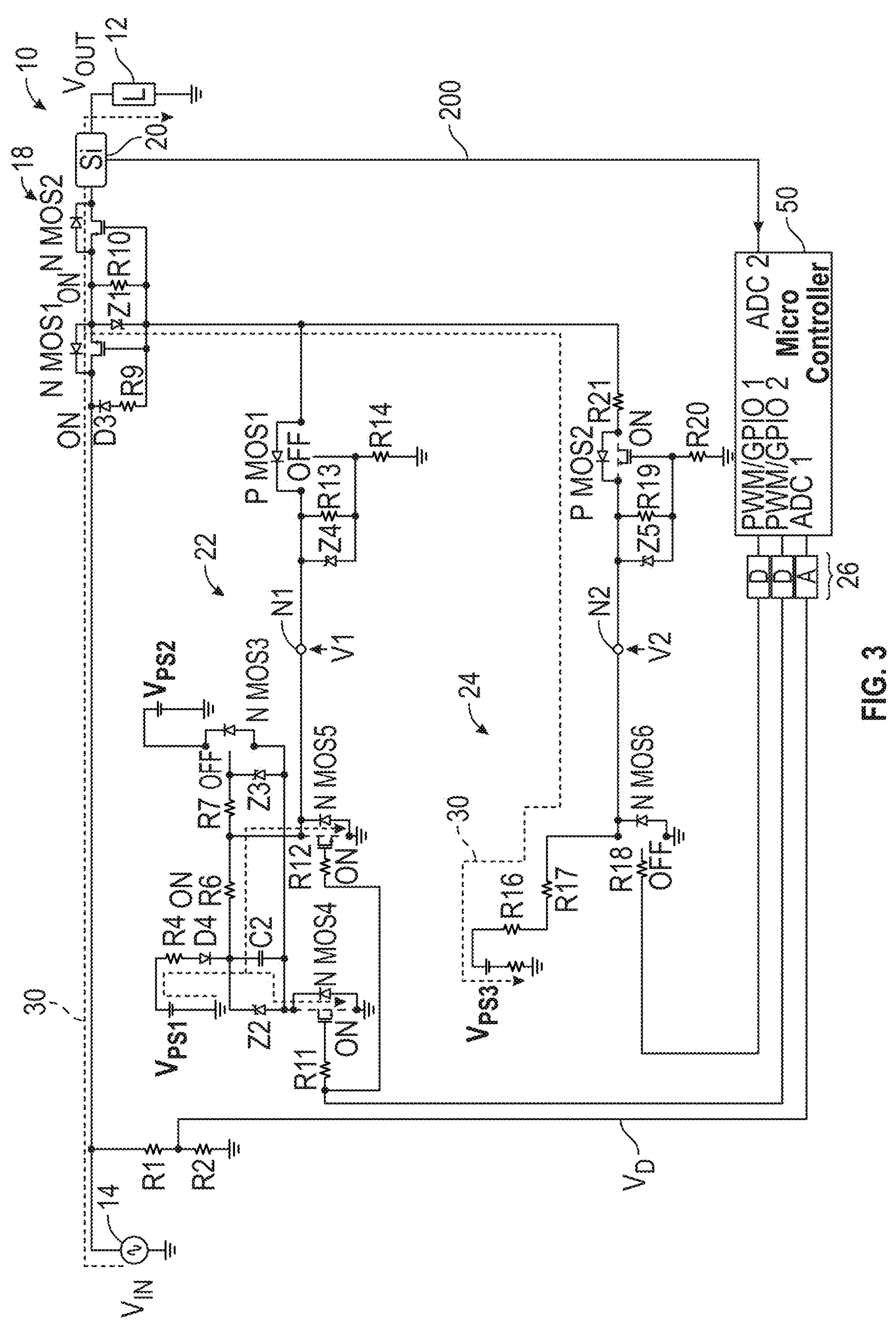
FIG. 3 illustrates operation of the SSGD circuit of FIG. 2B during a negative half-cycle of an alternating current (A C) input voltage in accordance with an embodiment.

NEGATIVE HALF-CYCLE: Referring to FIG. 3, the microcontroller 50 transitions NMOS4 and NMOS to an ON state during the negative half-cycle 15N of FIG. 1. NMOS3 is turned OFF at the same time. This condition allows the capacitor C2 to be charged by the first voltage power supply V Psi as noted above. In this mode, the Zener diode Z2 limits the voltage stored in the capacitor C2. PMOS1 is commanded OFF, i.e., opened, because NMOS5 connects the source terminal of PMOS1 directly to ground. As a result, $V_{GS}$=0V for PMOS1.

In this case, $V_{Z3}$=0V, $V_{Z4}$=0V, and V1=0V. Additionally, $V_{C2}$=$V_{Z2}$, with Zener diode Z2 limiting the voltage of capacitor C2, and $$V_{PS1} = \frac{V_{PS2}}{2}.$$

Current trace 30 represents the direction of current flow to the load 12 through the bilateral transistor switch 18. At the beginning of the negative half-cycle 15N, i.e., with $V_{IN}$=0V, PMOS2 allows the third voltage power supply $V_{PS3}$ to supply the voltage $V_{Z1}$ to transition NMOS1 and NMO2 to an ON/conducting state. NMOS6 is OFF/open in this state. Thus, when $V_{IN}$=0V, $V_{GS1}$=$V_{GS2}$=$V_{Z1}$ supplied by the third voltage power supply $V_{PS3}$. As the AC input voltage $V_{IN}$ decreases during the negative half-cycle 15N, $V_{Z1}$ gradually increases from the level of $V_{PS3}$ to $V_{IN}$ to follow the following equation:

$$V_{Z1} = V_{IN} + V_{PS3} + V_{R16} + V_{R17} - V_{R21}.$$

POSITIVE HALF-CYCLE: Referring now to FIG. 4, control during the positive half-cycle 15P of FIG. 1 occurs with the microcontroller 50 transitioning NMOS6 to an ON/conducting state. This condition will turn OFF PMOS2. At the same time, PMOS1 is turned ON, while diode D4, NMOS4, NMOS5, and NMOS6 are turned OFF/opened. The voltage across capacitor C2 adds to that of the second voltage power supply $V_{PS2}$. In this case:

$$V_{G1} = V_{G2} = V_{PS2} + V_{C2} - V_{R6} - R_{DSON\_PMOS1}$$

$$V_{GS1} = V_{GS2} = V_{G1} - V_{S1}$$

$$V_{GS1} = V_{G1} - V_{IN} = V_{Z1}$$

$$V_{G1} = V_{IN} + V_{Z1}$$

where $V_{G1}$ and $V_{G2}$ are related at the gate voltage of NMOS1 and NMOS2, respectively, $V_{GS1}$ is predefined (by datasheet), and $R_{DSON}$ is the drain-to-source ON-state resistance of PMOS1. Thus, during the positive half-cycle 15P of FIG. 1, the positive branch circuit 16P supplies the output voltage V1 as:

$$V_1 = V_{IN} + V_{Z1}$$

This condition allows NMOS1 and NMOS2 to turn ON/conduct.

OFF STATE: Referring to FIG. 5, the OFF state of the SSGD circuit 10 may be set by the microcontroller 50 by transitioning NMOS4, NMOS5, and NMOS6 to an ON/conducting state and transitioning NMOS3, PMOS1, and PMOS2 to an OFF/open/non-conducting state. In this case:

$$V_{OUT} = V_1 = V_2 = 0V$$

-continued $$V_{GS1} = V_{GS2} = 0V$$

The following table summarizes operation of the SSGD circuit 10 in the negative half-cycle 15N, positive half-cycle 15P, and off state of FIGS. 3, 4, and 5, respectively:

| SWITCH # | NEGATIVE H-C | POSITIVE H-C | OFF STATE |
|---|---|---|---|
| NMOS 1 | ON | ON | OFF |
| NMOS 2 | ON | ON | OFF |
| NMOS 3 | OFF | ON | OFF |
| NMOS 4 | ON | OFF | ON |
| NMOS 5 | ON | OFF | ON |
| NMOS 6 | OFF | ON | ON |
| PMOS 1 | OFF | ON | OFF |
| PMOS 2 | ON | OFF | OFF |
| D4 | ON | OFF | ON |

Figure 6A:
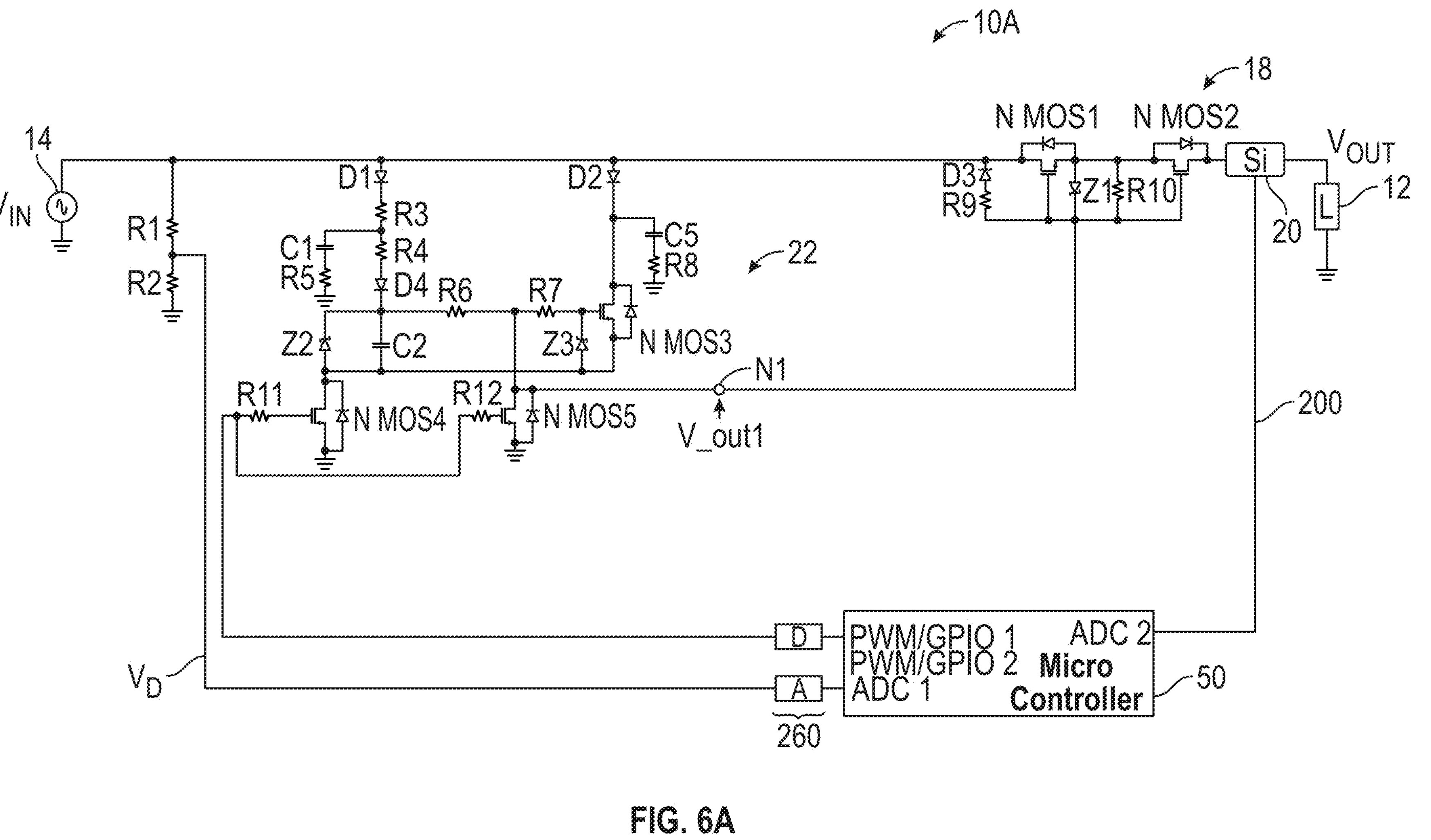
FIG. 6A illustrates an alternative circuit topology for direct current (DC) applications.

DC MODE: Referring to FIG. 6A, the AC circuit topology of the preceding disclosure may be modified for use in DC applications, i.e., those having a DC power supply 140 such as a battery pack, solar array, or fuel cell stack. For a DC application, the negative branch circuit 16N of FIG. 2 and some of the second plurality of semiconductor power switches 24 may be depopulated or bypassed, given the positive polarity of the input voltage $V_{IN}$. In this particular DC embodiment, the bilateral transistor switch 18 is connected to one of the three illustrated NMOS transistors NMOS3, NMOS4, or NMOS5. Traditional switching control algorithms may be used in the implementation of FIG. 6A to control the ON/OFF state of the bilateral transistor switch 18.

Figure 6B:
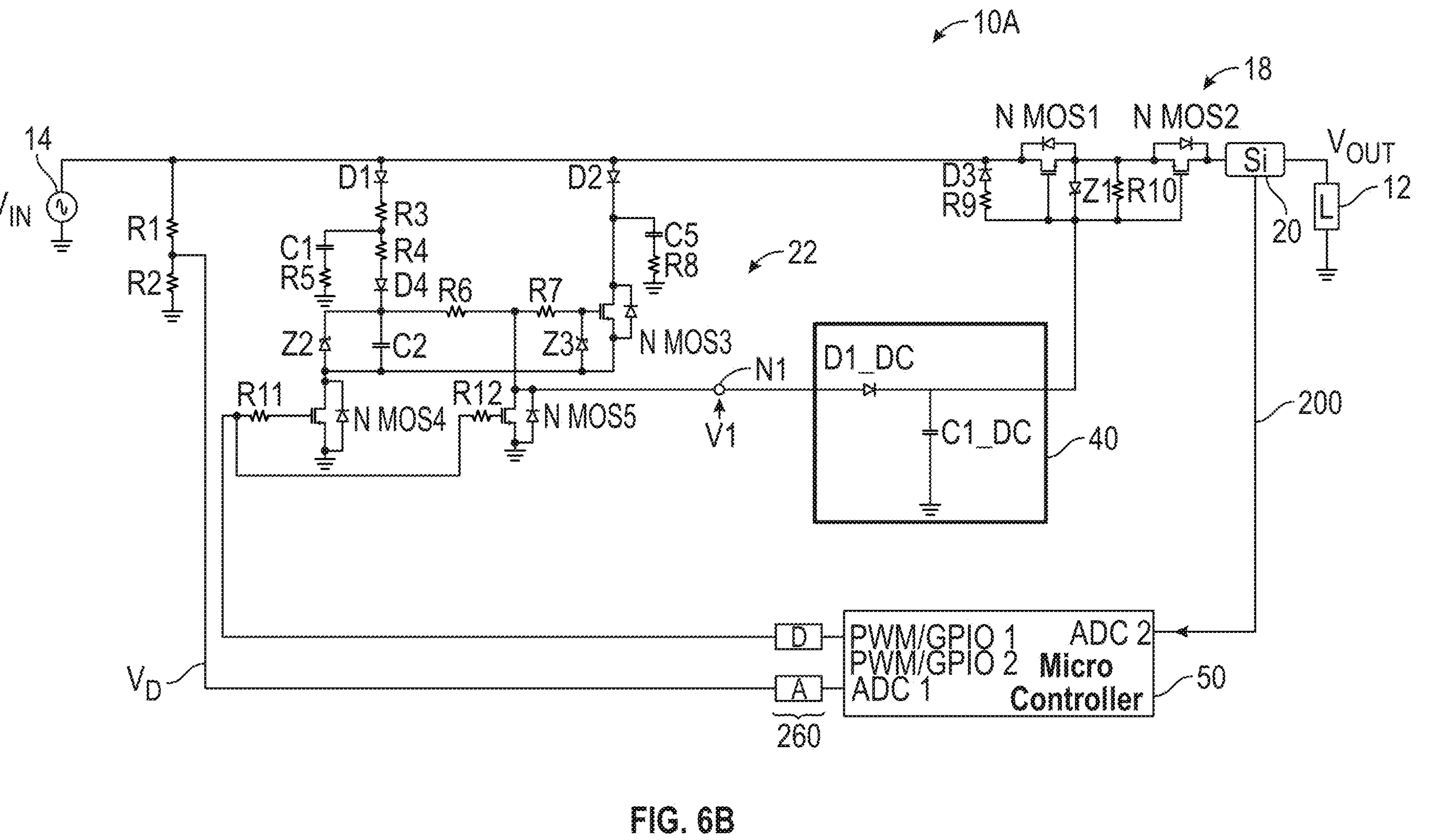
FIG. 6B illustrates an embodiment of the alternative circuit topology of FIG. 6A that may be controlled using a Linear Slope Control (LSC) algorithm.

Alternatively as shown in FIG. 6B, the circuit topology of FIG. 6A may be modified for use to enable control of the bilateral transistor switch 18 using a Linear Slope Control (LSC) algorithm. The representative circuit topology of FIG. 6B may be implemented by depopulating the PMOS1 transistor of the first plurality of semiconductor power switches 22, as well as the corresponding Zener diode Z4 and resistors R13 and R14 of FIG. 6A. To implement the DC LSC mode topology of FIG. 6B, a DC block 40 is added between node N1 and the bilateral transistor switch 18 as shown. DC block 40 includes a steering diode D1_DC situated between the node N1 and Zener diode Z1 of the bilateral transistor switch 18. A n additional capacitor, C1_DC, is added between the output of the steering diode D1_DC and ground.

The alternative SSGD circuit 10A of FIG. 6B thus includes the bilateral transistor switch 18, which remains connected to the electrical load 12, and the plurality of semiconductor power switches 22. The power switches 22 remain configured to direct energy from the input voltage $V_{IN}$ to the electrical load 12 via the bilateral transistor switch 18, with the power switches 22 including three NMOS transistors, i.e., NMOS3, NMOS4, and NMOS5, as before. The steering diode D1_DC is connected to the bilateral transistor switch 18 and one of the three NMOS transistors, in this case the transistor labeled NMOS3. The microcontroller 50 in this implementation is configured to carry out the linear slope control algorithm noted above, doing so in response to the current signal 200 and other inputs as needed. The microcontroller 50 thus controls an ON/OFF switching state of the plurality of semiconductor power switches 22 and the bilateral transistor switch 18 to thereby energize the electrical load 12. The SSGD circuit 10A as shown in FIG. 6B also remains characterized by an absence of an operational amplifier.

Figure 7:
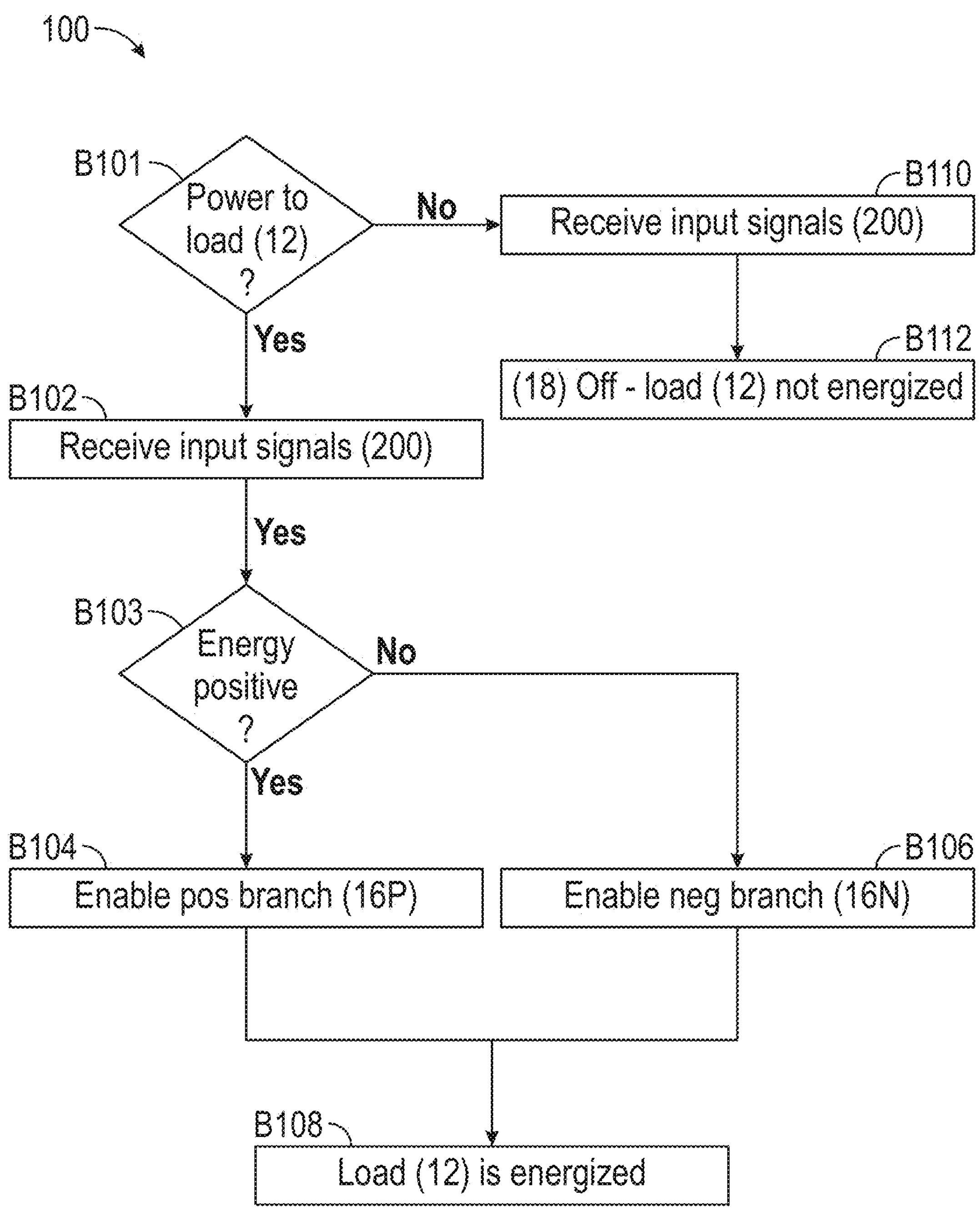
FIG. 7 is a flow chart illustrating a method for energizing an electrical load via the SSGD circuit in one or more of the embodiments described herein.

Referring to FIG. 7, a method 100 may be embodied as a series of code segments or logic blocks executable by the microprocessor 50 when controlling an output state of the solid-state gate driver (SSGD) circuit 10.

A n embodiment of the method 100 for energizing the electrical load 12 via the SSGD circuit 10 may commence at block B101 with the microcontroller 50 determining whether it has received a request or a command to energize the load 12. The method 100 proceeds to block B102 when such a command has been received, and to block B110 in the absence of the command to energize the load 12.

Block B102 includes receiving the current signal 200 (and potentially the voltage $V_D$ and other input signals 200) via the microcontroller 50. As noted above, the input signals are indicative of at least a magnitude and a polarity of a current being delivered to the electrical load 12 across the bilateral transistor switch 18. The microcontroller 50 as part of block B102 may measure the current polarity through the resistors R1 and R2, the isolator circuit 26, and the A DC input to the microcontroller 50. Block B102 (or a separate block) may include measuring the magnitude of the current via the sensor 20, e.g., a bipolar H all effect sensor, and transmitting the input signals 200 to the microcontroller 50. The method 100 proceeds to block B103 after determining the magnitude and the polarity of the current at block B102.

Block B103 entails determining, via the microcontroller 50 using the polarity determination of block B102, whether an energy flow direction to the load 12 is positive or negative. The method 100 proceeds to block B104 when energy flow direction is positive, with the method 100 proceeding to block B106 in the alternative when the energy flow direction is negative.

At block B104, the method 100 of FIG. 7 includes enabling the positive branch circuit 16P and disabling/turning off the negative branch circuit 16N. The method 100 thereafter proceeds to block B108.

At block B106, which is analogous to block B104, the microprocessor 50 enables the negative branch circuit 16N and disabled/turns off the positive branch circuit 16P. The method 100 thereafter proceeds to block B108.

At block B108, the method 100 includes energizing the load 12 using positive energy via the positive branch circuit 16P (if enabled at block B104) or negative energy via the negative branch circuit 16N (if enabled at block B106). The method 100 includes directing the positive or negative energy from the respective positive or negative half-cycle 15P or 15N (FIG. 1) of the input voltage $V_{IN}$ to the electrical load 12 via the respective positive or negative branch circuit 16P or 16N and operation of the bilateral transistor switch 18.

Directing positive energy from the positive half-cycle 15P includes controlling, via the microcontroller 50, an ON/OFF state of the bilateral transistor switch 18 and the first plurality of semiconductor power switches 22 of the positive branch circuit 16P. This may include controlling the ON/OFF state of three NMOS transistors, i.e., NMOS4, NMOS4, and NMOS5, as the first plurality of semiconductor switches 22.

Analogously, directing negative energy from the negative half-cycle 15N (FIG. 1) of the input voltage $V_{IN}$ to the electrical load 12 occurs via operation of the negative branch circuit 16N and the bilateral transistor switch 18. Directing the negative energy from the negative half-cycle 15N includes controlling an ON/OFF state of the second plurality of semiconductor power switches 15N of the negative branch circuit 16N via the microcontroller 50. This action may entail controlling an ON/OFF state of a single NMOS transistor, or NMOS6 of FIG. 2, and a single PMOS transistor, i.e., PMOS2.

Block B110 is analogous to block B102, and includes receiving the current signal 200 (and potentially other input signals 200) via the microcontroller 50. The input signals 200 are indicative of at least a magnitude and a polarity of a current being delivered to the electrical load 12 across the bilateral transistor switch 18. The microcontroller 50 as part of block B110 may measure the current polarity through the resistors R1 and R2, the isolator circuit 26, and the ADC input ADC1 to the microcontroller 50. Block B110 (or a separate block) may also include measuring the magnitude of the current via the sensor 20. The method 100 proceeds to block B112 after determining the magnitude and the polarity of the current at block B110.

At block B112, the microcontroller 50 turns OFF the bilateral transistor switch 18 to ensure that the load 12 is not energized. The method 100 is then complete, resuming with block B101.

Implementation of the method 100 may include directing the positive energy from the positive half-cycle 15P and directing the negative energy from the negative half-cycle 15N by ON/OFF state control of the various MOS transistors. As shown in FIG. 2B, the Zener diode Z2 is connected in parallel with the capacitor C2, with the method 100 including limiting a voltage stored in the capacitor C2 using the Zener diode Z2.

Using the solid-state gate driver (SSGD) circuits 10 or 10A as described above, the load 12 may be energized via voltages or currents driven by separate positive and negative branch circuits 16P and 16N. The present teachings offer simplified circuit complexity, reduced distortion (e.g., relative to circuits requiring zero-crossing detection logic, operational amplifiers, comparator circuits, etc.), and reduced power dissipation within the various constituent transistors of the described circuit topologies. Switching control approaches such as traditional PWM, pulse-density modulation (PDM), etc., or alternative methods such as Linear Slope Control (LSC), may be used to turn on the SSGD circuits 10, 10A. For example, an LSC algorithm may be used to manage inrush currents during switching, e.g., by controlling the gate drive signal of the various solid-state power switches described herein so as to create a linear ramp-up/ramp-down of current rather than an instantaneous switch. These and other advantages of the present teachings will be readily appreciated by those possessing ordinary skill in the art and now having the advantage of the present disclosure.

While several modes for carrying out the many aspects of the present teachings have been described in detail, those familiar with the art to which these teachings relate will recognize various alternative aspects for practicing the present teachings that are within the scope of the appended claims. The above description and accompanying drawings are illustrative and representative of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments.

Moreover, the present concepts expressly include combinations and sub-combinations of the described elements and features. The detailed description and the drawings are supportive and descriptive of the present teachings, with the scope of the present teachings defined solely by the claims. Words of approximation, such as "about," "almost," "substantially," "generally," "approximately," and the like, may each be used herein to denote "at, near, or nearly at," or "within 0-5% of," or "within acceptable manufacturing tolerances," or any logical combination thereof, for example.

We claim:

1. A solid-state gate driver (SSGD) circuit for energizing an electrical load, the SSGD circuit comprising:

a bilateral transistor switch connected to the electrical load;

a positive branch circuit connected to the bilateral transistor switch, the positive branch circuit comprising a first plurality of semiconductor power switches configured to direct energy to the electrical load, via the bilateral transistor switch, from a positive half-cycle of an alternating current (AC) input voltage;

a negative branch circuit connected to the bilateral transistor switch, the negative branch circuit comprising a second plurality of semiconductor power switches configured to direct energy to the electrical load, via the bilateral transistor switch, from a negative half-cycle of the AC input voltage; and a microcontroller configured to control an ON/OFF switching state of the first plurality of semiconductor power switches, the second plurality of semiconductor power switches, and the bilateral transistor switch to thereby energize the electrical load.

2. The SSGD circuit of claim 1, further comprising:

a current sensor connected between the bilateral transistor switch and the electrical load, wherein the current sensor is configured to:

measure a current output of the bilateral transistor switch; and provide an input signal to the microcontroller, the input signal being indicative of a magnitude and a polarity of the current output of the bilateral transistor switch.

3. The SSGD circuit of claim 2, wherein the current sensor includes a bipolar H all effect sensor.

4. The SSGD circuit of claim 1, wherein the first plurality of semiconductor power switches includes three n-channel metal-oxide semiconductor (NMOS) transistors.

5. The SSGD circuit of claim 1, wherein the second plurality of semiconductor power switches includes:

a single n-channel metal-oxide semiconductor (NMOS) transistor; and a single p-channel metal-oxide semiconductor (PMOS) transistor, wherein the single PMOS transistor is connected between the bilateral transistor switch and the single NMOS transistor.

6. The SSGD circuit of claim 1, wherein the SSGD circuit is characterized by an absence of an operational amplifier.

7. The SSGD circuit of claim 1, wherein the first plurality of semiconductor power switches of the positive branch circuit and the second plurality of semiconductor power switches of the negative branch circuit together form three half-wave rectifiers operable as three separate power sources.

8. The SSGD circuit of claim 7, wherein a first power source of the three separate power sources is part of the positive branch circuit, and wherein the first power source is connected to a Zener diode that is connected in parallel with a capacitor to limit a voltage stored in the capacitor.

9. The SSGD circuit of claim 1, wherein the SSGD circuit is configured as a solid-state circuit breaker.

10. The SSGD circuit of claim 1, wherein the SSGD circuit is configured as a solid-state relay.

11. A method for energizing an electrical load via a solid-state gate driver (SSGD) circuit, the method comprising:

receiving an input signal via a microcontroller, the input signal being indicative of a magnitude and a polarity of a current being delivered to the electrical load by a bilateral transistor switch of the SSGD circuit, wherein the SSGD circuit includes the bilateral transistor switch, a positive branch circuit, and a negative branch circuit;

directing energy from a positive half-cycle of an alternating current (AC) input voltage to the electrical load via the positive branch circuit and the bilateral transistor switch, including controlling, via the microcontroller, an ON/OFF state of the bilateral transistor switch and a first plurality of semiconductor power switches of the positive branch circuit; and directing energy from a negative half-cycle of the AC input voltage to the electrical load, via the negative branch circuit and the bilateral transistor switch, including controlling an ON/OFF state of the bilateral transistor switch and a second plurality of semiconductor power switches of the negative branch circuit via the microcontroller.

12. The method of claim 11, further comprising:

measuring the magnitude and the polarity of the current via a current sensor; and communicating the magnitude and the polarity of the current to the microcontroller as part of the input signal.

13. The method of claim 12, wherein measuring the magnitude and the polarity of the current via the current sensor includes sensing the magnitude and the polarity of the current using a bipolar H all effect sensor.

14. The method of claim 11, wherein controlling the ON/OFF state of the bilateral transistor switch and the first plurality of semiconductor power switches includes controlling the ON/OFF state of three n-channel metal-oxide semiconductor (NMOS) transistors as the first plurality of semiconductor power switches.

15. The method of claim 11, wherein controlling the ON/OFF state of the second plurality of semiconductor power switches of the negative branch circuit includes:

controlling an ON/OFF state of a single n-channel metal-oxide semiconductor (NMOS) transistor and a single p-channel metal-oxide semiconductor (PMOS) transistor.

16. The method of claim 11, wherein the first plurality of semiconductor power switches and the second plurality of semiconductor power switches together form three half-wave rectifiers operable as three separate power sources, the method further comprising:

directing the energy from the positive half-cycle and directing the energy from the negative half-cycle by controlling an output state of the three half-wave rectifiers.

17. The method of claim 16, wherein a first power source of the three separate power sources is part of the positive branch circuit, and wherein a Zener diode is connected to the first power source and in parallel with a capacitor, the method further comprising:

limiting a voltage stored in the capacitor using the Zener diode.

18. A solid-state gate driver (SSGD) circuit for energizing an electrical load, the SSGD circuit comprising:

a bilateral transistor switch connected to the electrical load;

a plurality of semiconductor power switches configured to direct energy from a direct current (DC) power supply to the electrical load via the bilateral transistor switch, the plurality of semiconductor power switches including three n-channel metal-oxide semiconductor (NMOS) transistors; and a microcontroller configured, in response to an input signal, to control an ON/OFF switching state of the plurality of semiconductor power switches and the bilateral transistor switch to thereby energize the electrical load, wherein the SSGD circuit is characterized by an absence of an operational amplifier.

19. The SSGD circuit of claim 18, further comprising:

a current sensor connected between the bilateral transistor switch and the electrical load, wherein the current sensor is configured to:

measure a current output of the bilateral transistor switch; and output a current signal to the microcontroller as part of the input signal, the current signal being indicative of a magnitude and a polarity of the current output.

20. The SSGD circuit of claim 18, further comprising:

a steering diode, wherein the bilateral transistor switch includes a pair of back-to-back n-channel metal-oxide semiconductor (NMOS) transistors and a Zener diode, and wherein the steering diode is connected to the Zener diode.

* * * * *